US007737531B2

United States Patent
Sugawara et al.

(10) Patent No.: US 7,737,531 B2
(45) Date of Patent: Jun. 15, 2010

(54) WAFER INCLUDING A REINFORCING FLANGE FORMED UPRIGHT AT A PERIPHERY AND METHOD FOR MANUFACTURING THE SAME

(75) Inventors: Yasuharu Sugawara, Kanagawa-ken (JP); Motoshige Kobayashi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 12/253,610

(22) Filed: Oct. 17, 2008

(65) Prior Publication Data

US 2009/0102020 A1    Apr. 23, 2009

(30) Foreign Application Priority Data

Oct. 19, 2007    (JP) .............. 2007-272282

(51) Int. Cl.
*H01L 29/06*    (2006.01)
*H01L 21/311*    (2006.01)

(52) U.S. Cl. .............. 257/619; 257/E21.536; 438/694

(58) Field of Classification Search ........ None
See application file for complete search history.

(56) References Cited

U.S. PATENT DOCUMENTS

| | | | | |
|---|---|---|---|---|
| 6,162,702 | A * | 12/2000 | Morcom et al. ........... | 438/459 |
| 7,413,501 | B2 * | 8/2008 | Priewasser ................ | 451/41 |
| 2007/0141955 | A1 * | 6/2007 | Masuda .................... | 451/11 |
| 2007/0231929 | A1 * | 10/2007 | Kajiyama et al. ......... | 438/6 |
| 2008/0045015 | A1 * | 2/2008 | Sekiya ..................... | 438/691 |

FOREIGN PATENT DOCUMENTS

JP    2000-260670    9/2000

* cited by examiner

*Primary Examiner*—Thanh V Pham
*Assistant Examiner*—Andres Munoz
(74) *Attorney, Agent, or Firm*—Oblon, Spivak, McClelland, Maier & Neustadt, L.L.P.

(57) ABSTRACT

A wafer with an orientation notch being cut in a portion of its circumference, the wafer includes: a reinforcing flange formed upright at periphery; and a thin section surrounded by the reinforcing flange and having a smaller thickness than the reinforcing flange. The reinforcing flange includes a circumferential portion formed upright along the circumference and a notch portion formed upright near the orientation notch, and a width of the circumferential portion as viewed parallel to a major surface of the wafer is smaller than a depth of the orientation notch as viewed parallel to the major surface.

8 Claims, 9 Drawing Sheets

FIG. 9

WAFER INCLUDING A REINFORCING FLANGE FORMED UPRIGHT AT A PERIPHERY AND METHOD FOR MANUFACTURING THE SAME

CROSS-REFERENCE TO RELATED APPLICATIONS

This application is based upon and claims the benefit of priority from the prior Japanese Patent Application No. 2007-272282, filed on Oct. 19, 2007; the entire contents of which are incorporated herein by reference.

BACKGROUND OF THE INVENTION

1. Field of the Invention

This invention relates to a wafer and a method for manufacturing the same.

2. Background Art

Transistors such as IGBT (insulated gate bipolar transistor) and power MOSFET (metal oxide semiconductor field effect transistor) are used in high-power switching circuits. In these transistors, the operating current flows vertically to the substrate. Hence, thinning the device thickness to reduce series resistance leads to reduced on-resistance during operation, allowing low power consumption.

On the other hand, wafer diameter is being increased to reduce the cost of semiconductor devices.

However, a wafer with a larger diameter is more susceptible to cracking, warpage, and chipping when it is thinned. This increases the ineffective region of the wafer and decreases the number of non-defective devices. A thick flange at the wafer periphery is an effective structure for preventing cracking, warpage, and chipping of the wafer while thinning the wafer to reduce series resistance.

With regard to a silicon wafer and a method for manufacturing the same, JP-A-2000-260670(Kokai) discloses a technique for reducing the wafer thickness without substantially decreasing the mechanical strength. In this technique, a recess is formed throughout one side or both sides of the silicon wafer excluding at least the wafer periphery. However, forming a flange causes a problem of increasing the ineffective region of the wafer.

SUMMARY OF THE INVENTION

According to an aspect of the invention, there is provided a wafer with an orientation notch being cut in a portion of its circumference, the wafer including: a reinforcing flange formed upright at periphery; and a thin section surrounded by the reinforcing flange and having a smaller thickness than the reinforcing flange, the reinforcing flange including a circumferential portion formed upright along the circumference and a notch portion formed upright near the orientation notch, and a width of the circumferential portion as viewed parallel to a major surface of the wafer being smaller than a depth of the orientation notch as viewed parallel to the major surface.

According to an aspect of the invention, there is provided a method for manufacturing a wafer, the wafer with an orientation notch being cut in a portion of its circumference, the wafer including: a reinforcing flange formed upright at periphery; and a thin section surrounded by the reinforcing flange and having a smaller thickness than the reinforcing flange, the reinforcing flange including a circumferential portion formed upright along the circumference and a notch portion formed upright near the orientation notch, and the width of the circumferential portion as viewed parallel to a major surface of the wafer being smaller than the depth of the orientation notch as viewed parallel to the major surface, the method including: forming a mask at the periphery; and forming the reinforcing flange by etching a portion not covered with the mask.

According to an aspect of the invention, there is provided a wafer with an orientation flat formed by cutting out a portion of its circumference, the wafer including: a reinforcing flange formed upright at periphery; and a thin section surrounded by the reinforcing flange and having a smaller thickness than the reinforcing flange, as viewed parallel to a major surface of the wafer, a width of the reinforcing flange at the circumference being generally equal to a width of the reinforcing flange at the orientation flat.

According to an aspect of the invention, there is provided a method for manufacturing a wafer, the wafer with an orientation flat formed by cutting out a portion of its circumference, the wafer including: a reinforcing flange formed upright at periphery; and a thin section surrounded by the reinforcing flange and having a smaller thickness than the reinforcing flange, as viewed parallel to a major surface of the wafer, a width of the reinforcing flange at the circumference being generally equal to a width of the reinforcing flange at the orientation flat, the method including: forming a mask at the periphery; and etching a portion not covered with the mask.

DETAILED DESCRIPTION OF THE INVENTION

Embodiments of the invention will now be described with reference to the drawings.

FIG. 1 shows a semiconductor wafer according to a first embodiment of the invention. More specifically, FIG. 1A is a schematic plan view, FIG. 1B is a schematic cross-sectional view taken along line A-A, FIGS. 1C and 1D are schematic plan views in which the vicinity of the notch is enlarged, and FIGS. 1E and 1F are schematic cross-sectional views in which the periphery is enlarged.

Figure 1A:
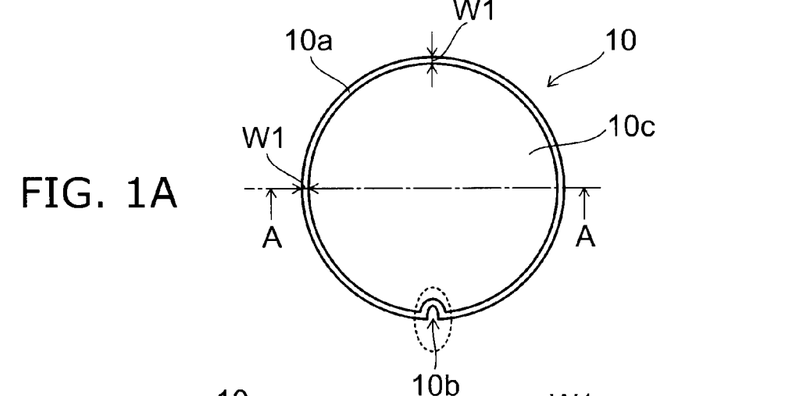
FIGS. 1A to 1F are schematic views of a wafer according to a first embodiment.

The wafer 10 is a silicon wafer on which devices such as IGBT and power MOSFET are formed. The wafer 10 illustratively has a diameter of 8 inches and a thickness T1 of 750 µm. It is understood that the material, purpose, diameter, and thickness of the wafer 10 is not limited thereto.

Figure 1B:
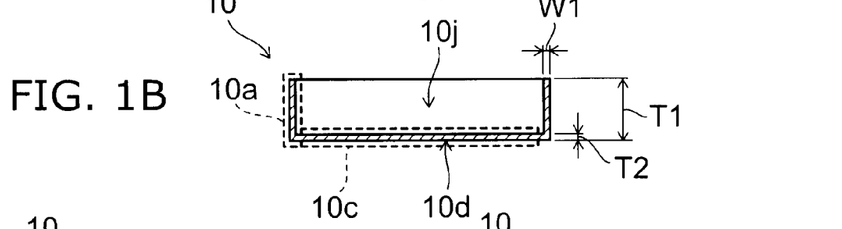

The wafer 10 has a reinforcing flange 10a having a large thickness and formed upright at its periphery, and a recess 10j is formed inside the reinforcing flange 10a. A thin section 10c having a small thickness corresponds to the recess 10j. A plurality of devices such as IGBT and power MOSFET are formed in the thin section 10c. These devices can be illustratively formed from the first surface 10d side of the wafer 10.

The thickness T1 of the reinforcing flange 10a is illustratively 750 µm, and the thickness T2 of the thin section 10c is illustratively 100 µm. As described later in detail, the wafer 10 of this embodiment can be manufactured by polishing and/or etching a thick wafer to form a recess 10j. The method of polishing can include mechanical and mechanochemical polishing. The method of etching can be wet etching or dry etching. Furthermore, polishing and etching can be combined together.

In IGBT and power MOSFET, the current flows in the vertical direction (thickness direction) of the substrate. Hence, a chip with a large thickness has a high series resistance. This leads to increased on-resistance during operation and increased power consumption. In this embodiment, the thin section 10c, where devices are formed, illustratively has a thickness of 100 µm or less. Even with this thin section 10c, the mechanical strength of the wafer 10 can be kept high because of the presence of the reinforcing flange 10a.

The wafer 10 is provided with an orientation notch (hereinafter also simply referred to as notch) 10b, which is cut in a portion of the circumference to identify crystal orientation. The notch 10b is formed as an incision (depth N) perpendicular to the surface of the wafer 10. The reinforcing flange 10a includes a portion formed upright along the circumference of the wafer 10 (the portion other than the portion enclosed by the dashed line in FIGS. 1A, 1C, and 1D) and a portion formed upright near the orientation notch 10b (the portion enclosed by the dashed line in FIGS. 1A, 1C, and 1D). In this embodiment, the width W1 of the reinforcing flange 10a as viewed parallel to the major surface of the wafer 10 is decreased so that the reinforcing flange 10a includes a portion smaller than the incision depth N of the notch 10b as long as the mechanical strength of the wafer 10 can be maintained. That is, the width W1 of the reinforcing flange 10a at least at its circumferential portion is made smaller than the depth N of the orientation notch 10b. For example, in the case where the depth N of the notch 10b is 1.2 mm, then W1 is set to 1 mm or less. This allows the thin section 10c of the wafer 10 to be expanded, and more devices can be formed therein accordingly. That is, the device manufacturing cost can be reduced.

Figure 2A:
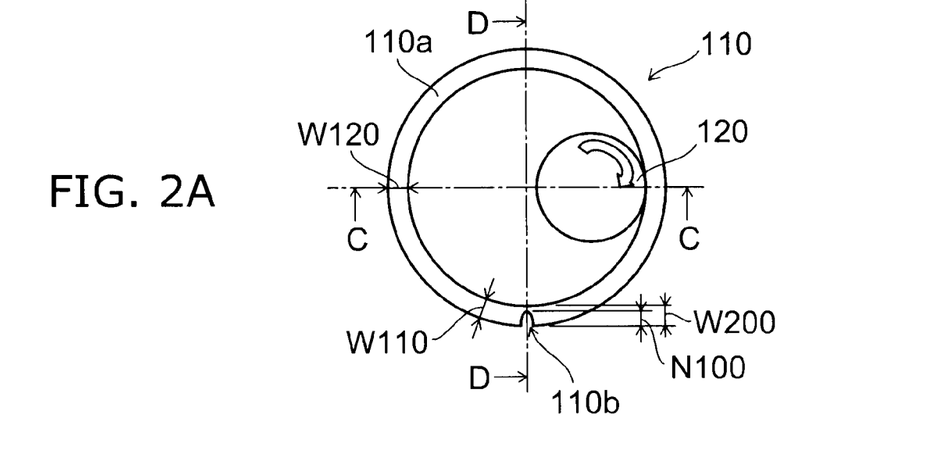
FIGS. 2A to 2C are schematic views of a wafer according to a comparative example.
Figure 2B:
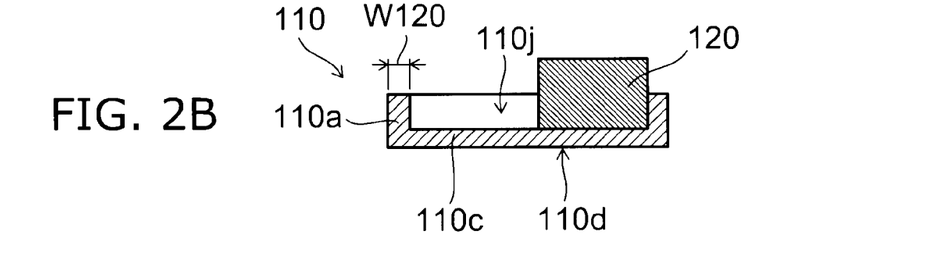
Figure 2C:
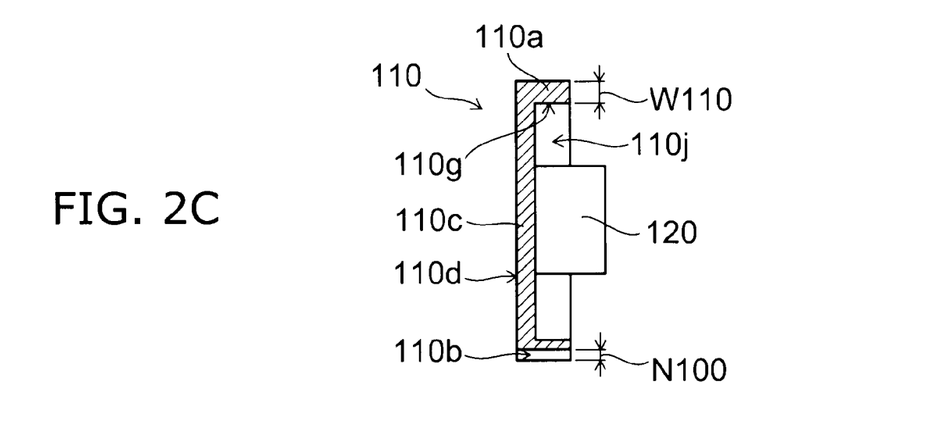

FIG. 2 shows a wafer according to a comparative example, in which FIG. 2A is a schematic plan view, FIG. 2B is a schematic cross-sectional view taken along line C-C, and FIG. 2C is a schematic cross-sectional view taken along line D-D. The wafer 110 has a first surface 110d with devices formed thereon, and the first surface 110d is covered illustratively with a protective tape. The wafer 110 is held on a chuck table, and the second surface opposite to the first surface 110d is mechanically polished illustratively using a grinding wheel 120. The chuck table with the wafer 110 held thereon and the grinding wheel 120 are rotated illustratively in opposite directions to form a thin section 110c having a thickness of 200 µm or less and a reinforcing flange 110a surrounding the thin section 110c. Here, the notch 110b has a notch depth of N100.

In the case of forming the reinforcing flange 110a by mechanical polishing, if the grinding wheel 120 has a large size, it is difficult to adapt the shape of the inner wall 10g of the reinforcing flange 110a to the incision shape of the notch 110b, and it is formed in a generally circular shape. In this case, the width W200 of the reinforcing flange 110a is larger than the depth N100 of the notch 110b. Consequently, the width W110, W120 of the reinforcing flange 110a at the periphery is illustratively as large as 3 to 5 mm. That is, the ineffective area of the wafer at the periphery increases, and the area of the thin section 110c decreases.

In addition, the reinforcing flange needs to be formed continuously throughout the outer periphery of the wafer. For example, if the reinforcing flange is not provided (is missing) in a portion of the outer periphery of the wafer, stress is likely to concentrate on the thin section in this portion. Consequently, cracking and/or chipping may occur in the missing portion of the reinforcing flange.

In contrast, this embodiment can maintain the mechanical strength while keeping the small thickness of the wafer 10, prevent cracking and warpage of the wafer during its handling such as transfer and measurement, and reduce the ineffective region of the wafer. Use of such a wafer 10 can realize IGBT and power MOSFET with reduced on-resistance and low power consumption during operation, and facilitates increasing the total number of devices per wafer. Furthermore, because a heat expandable tape and the like are not used, high-temperature heat treatment such as activation annealing can be performed.

Returning to FIG. 1, the wafer 10 of this embodiment is described.

Figure 1C:
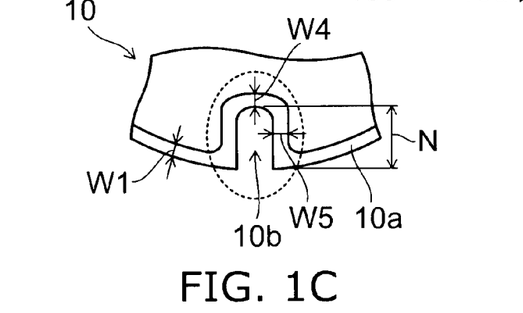

In the example shown in FIG. 1C, the width W4, W5 of the reinforcing flange 10a in the notch portion (indicated by the dashed line) is generally equal to the width W1 of the reinforcing flange 10a in the circumferential portion. This allows the thin section 10c to be expanded to the close proximity of the notch 10b to increase the effective area.

Figure 1D:
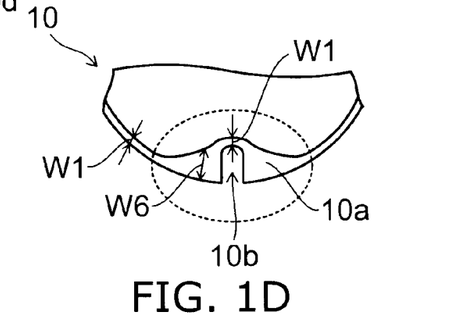

On the other hand, in the example shown in FIG. 1D, the width W6 of the reinforcing flange 10a in the notch portion (indicated by the dashed line) is larger than the width W1 of the reinforcing flange 10a in the circumferential portion. In this case, the area of the thin section 10c is slightly smaller than that in the example shown in FIG. 1C. However, this example is more advantageous in that the wafer can be easily processed even using a relatively large grinding wheel 120 (see FIG. 2). Also in the example shown in FIG. 1D, the width W1 of the reinforcing flange 10a in the circumferential portion can be reduced to effectively increase the area of the thin section 10c.

Furthermore, in this embodiment, the lower end and upper end of the inner wall 10g of the reinforcing flange 10a can be processed to have a gradual slope. In the example shown in FIG. 1E, the lower end of the inner wall 10g of the reinforcing flange 10a is provided with a taper 10e. On the other hand, in the example shown in FIG. 1F, the lower end of the inner wall 10g of the reinforcing flange 10a is provided with a downward convex curved surface 10f. Such a taper 10e and a curved surface 10f can further increase the mechanical strength of the wafer 10 and reduce local stress in the high-temperature heat treatment process such as activation annealing. Reduction of strain due to local stress serves to avoid crystal defects such as slips and improve device characteristics and reliability.

Figure 1E:
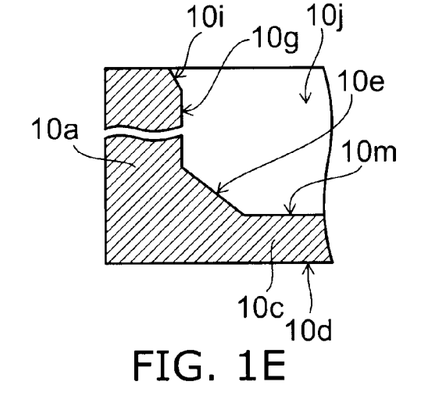
Figure 1F:
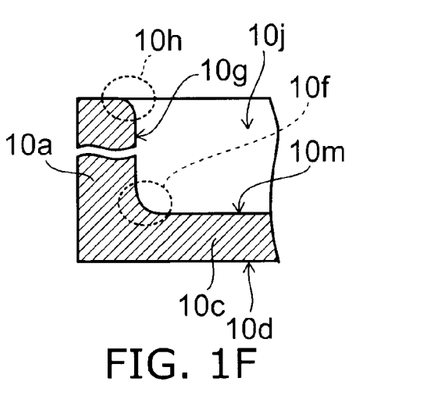

Furthermore, the upper end corner of the inner wall 10g of the reinforcing flange 10a can be also provided with a C (chamfered) surface 10i as shown in FIG. 1E or an upward convex curved surface 10h as shown in FIG. 1F. When the wafer 10 is used to manufacture semiconductor devices, the upper end corner of the inner wall 10g is often in contact with the manufacturing apparatus and inspection apparatus. However, these edging processes can avoid chipping and reduce dust generation.

Figure 3A:
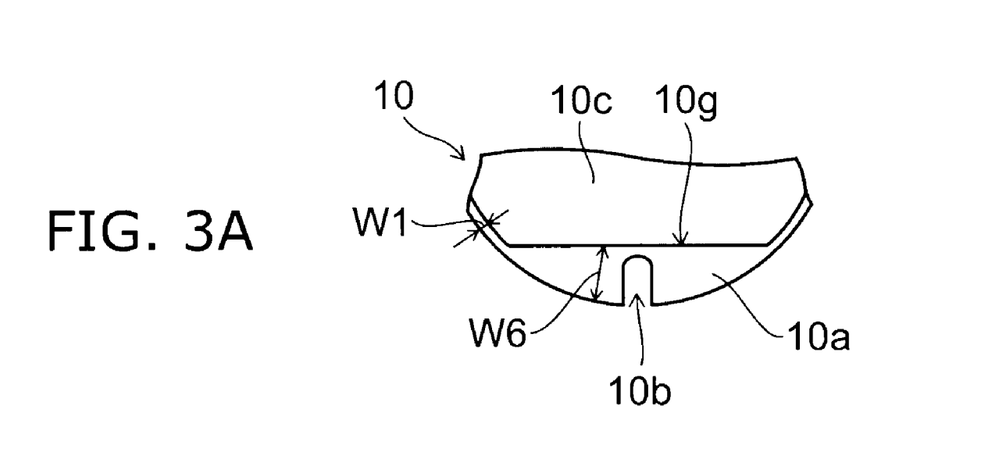
FIGS. 3A and 3B are partial schematic plan views showing a wafer according to variations of the first embodiment.
Figure 3B:
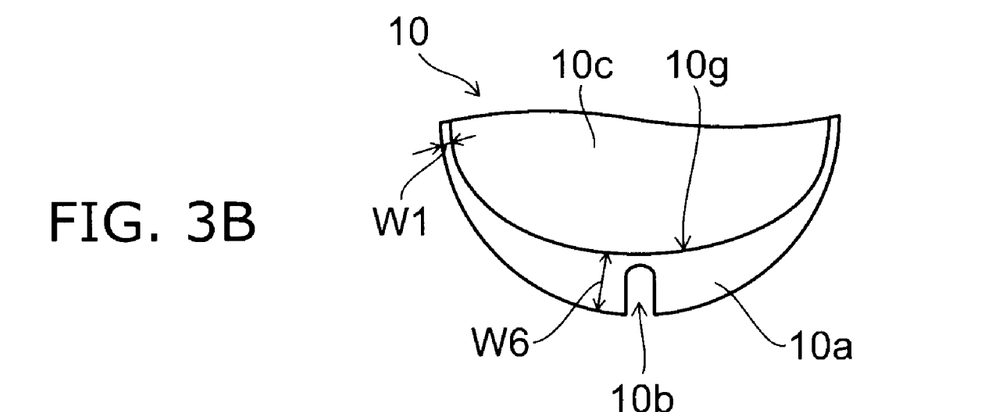

FIG. 3 is a partial schematic plan view showing a wafer according to variations of the first embodiment of the invention.

In the variation shown in FIG. 3A, the inner wall 10g of the reinforcing flange 10a in the notch portion is formed in a generally planar shape near the notch 10b. That is, in the notch portion, the width W6 of the reinforcing flange 10a as viewed parallel to the major surface of the wafer 10 is varied generally continuously. Furthermore, the width W1 of the reinforcing flange 10a in the circumferential portion is smaller than the width W6. Although this results in slightly decreasing the area of the thin section 10c in the notch portion, processing may be made relatively easy.

On the other hand, in the variation shown in FIG. 3B, the reinforcing flange 10a in the notch portion is formed so that its width W6 gradually decreases with the distance from the notch 10b. Furthermore, in the circumferential portion, the width W1 of the reinforcing flange 10a is sufficiently decreased. This allows the area of the thin section 10c to increase, and can further facilitate forming the reinforcing flange 10a in the notch portion. For example, as described above with reference to FIG. 2, the reinforcing flange 10a of this variation can be easily formed even using a relatively large grinding wheel 120.

Figure 4A:
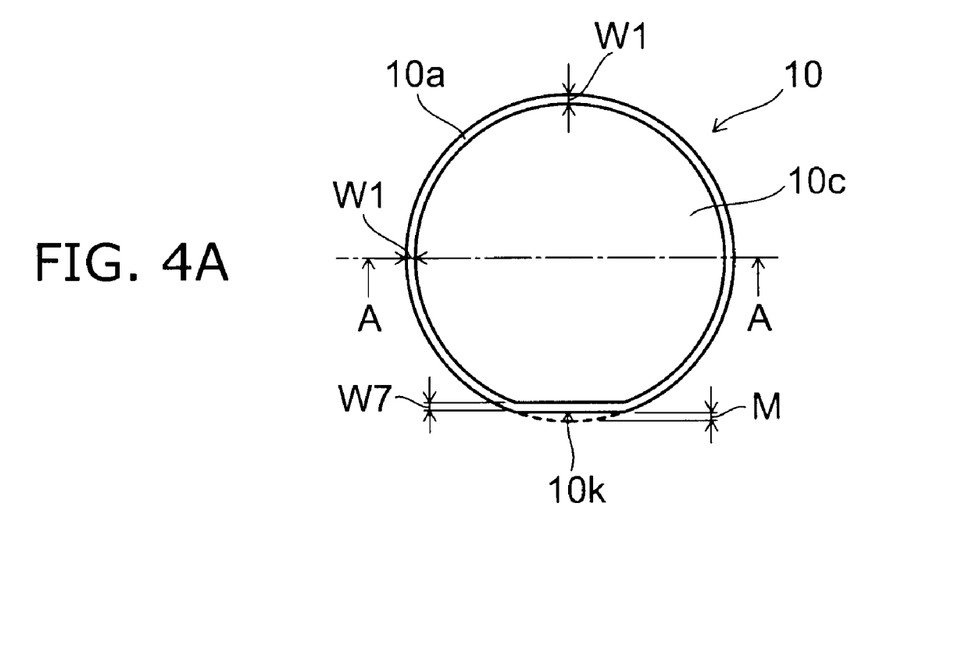
FIGS. 4A and 4B are schematic views of a wafer according to a second embodiment.
Figure 4B:
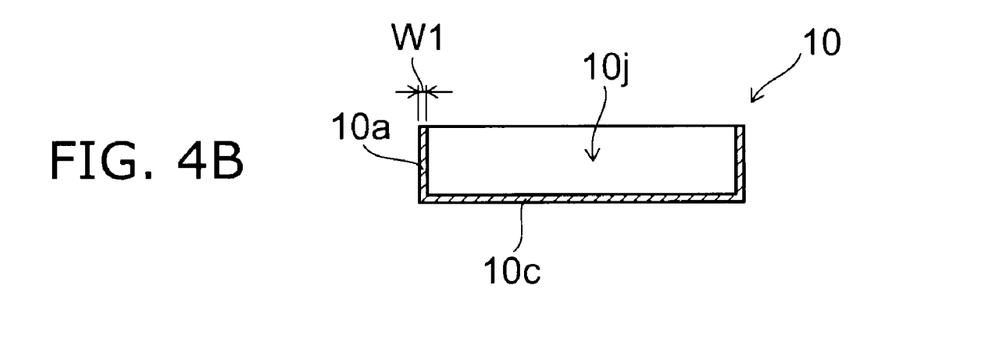

FIG. 4 shows a wafer according to a second embodiment of the invention, in which FIG. 4A is a schematic plan view thereof, and FIG. 4B is a schematic cross-sectional view taken along line A-A.

The wafer 10 of this embodiment is provided with an orientation flat 10k, which is a flat surface formed by cutting out a portion of the circumference. In this embodiment, the width W1 of the reinforcing flange 10a at the wafer periphery is generally equal to the width W7 of the reinforcing flange 10a along the orientation flat 10k.

Figure 5A:
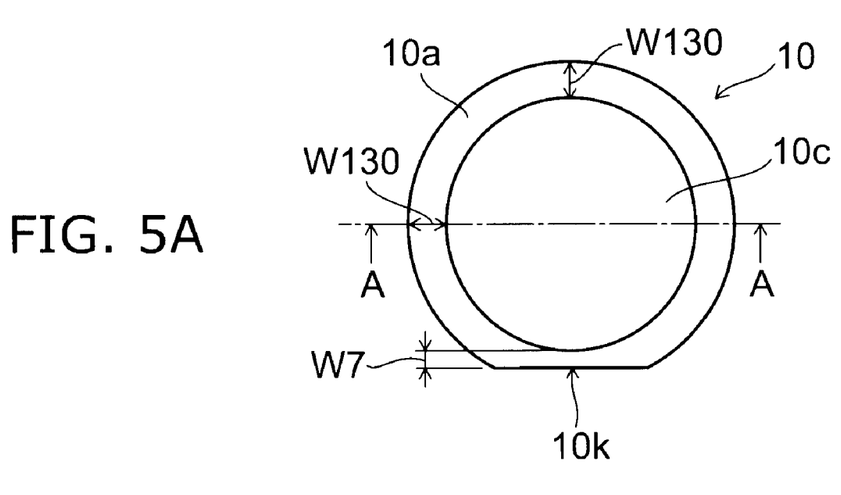
FIGS. 5A and 5B are schematic views of a wafer according to a comparative example.
Figure 5B:
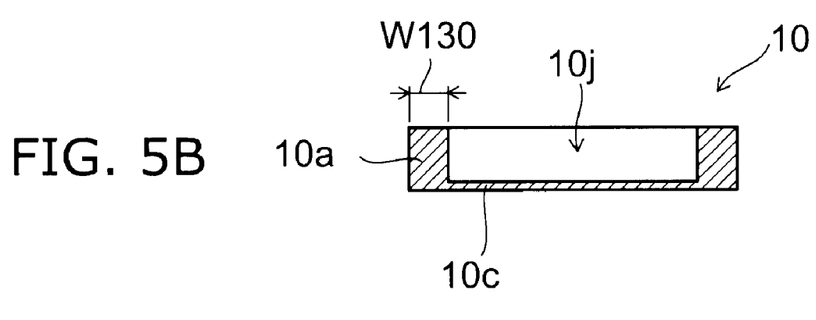

FIG. 5 shows a wafer of a comparative example, in which FIG. 5A is a schematic plan view thereof, and FIG. 5B is a schematic cross-sectional view taken along line A-A.

In this comparative example, like the comparative example described above with reference to FIG. 2, the thin section 10c has a generally circular shape in plan view. Like that described above with reference to FIG. 2, this can be obtained by uniformly polishing the wafer from its center toward the periphery using a grinding wheel 120.

In this comparative example, the width of the reinforcing flange 10a along the orientation flat 10k, in the portion of minimum width, is W7 as in the present embodiment shown in FIG. 4. However, in the other portion, the width of the reinforcing flange 10a increases. In the portion away from the orientation flat 10k, the width W130 of the reinforcing flange 10a is significantly larger than the width W1 in the present embodiment shown in FIG. 4. That is, the area of the thin section 10c decreases, the ineffective area of the wafer increases, and the chip yield decreases.

In contrast, in this embodiment, the widths W1, W7 of the reinforcing flange 10a at the wafer periphery including the vicinity of the orientation flat 10k are generally equalized and kept narrow, which facilitates reducing the ineffective area of the wafer. Like that described above with reference to FIG. 1, the reinforcing flange 10a of this embodiment can be formed illustratively by using a small grinding wheel or by etching.

It is noted that at both ends of the orientation flat 10k, the width of the reinforcing flange can be continuously varied. That is, in the example shown in FIG. 4, the width of the reinforcing flange 10a is varied discontinuously at the boundary between the portion of width W1 and the portion of width W7 of the reinforcing flange 10a. In contrast, the reinforcing flange 10a can be formed so that its width is varied continuously at the boundary between the portion of width W1 and the portion of width W7. This serves to achieve the effect of alleviating stress concentration like the effect of the taper 10e or the curved surface 10f described above with reference to FIG. 1E or 1F. Furthermore, this facilitates the formation process of polishing with a grinding wheel (see FIG. 2).

In this embodiment, in order to narrow the width of the reinforcing flange 10a while keeping its mechanical strength, the width W1 of the reinforcing flange 10a can illustratively be smaller than the cut width M of the orientation flat. In general, the orientation flat is often provided in a silicon wafer having a diameter of 6 inches or less.

As described above, this embodiment can also maintain the mechanical strength while keeping the small thickness of the wafer 10, prevent cracking and warpage of the wafer, and reduce the ineffective region of the wafer. Use of such a wafer 10 can realize IGBT and power MOSFET with reduced on-resistance and low power consumption during operation, and facilitates increasing the total number of devices per wafer.

Figure 6A:
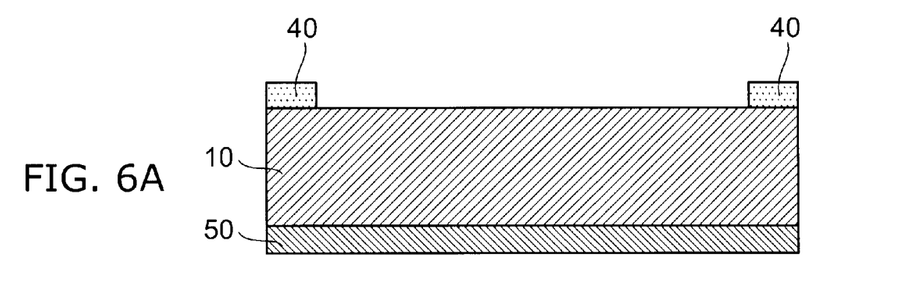
FIGS. 6A to 6C are process cross-sectional views illustrating a method for manufacturing.
Figure 6B:
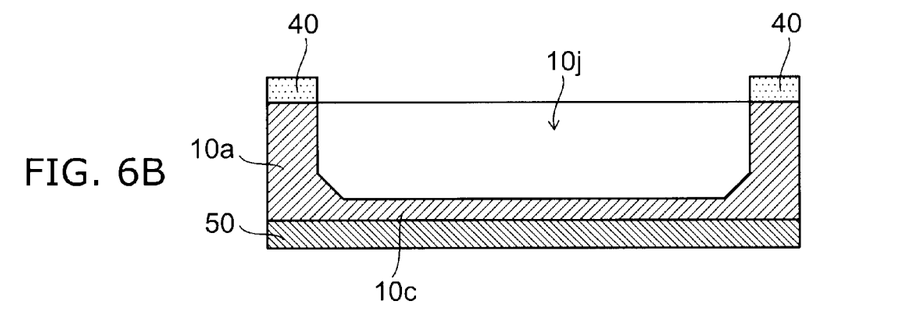
Figure 6C:
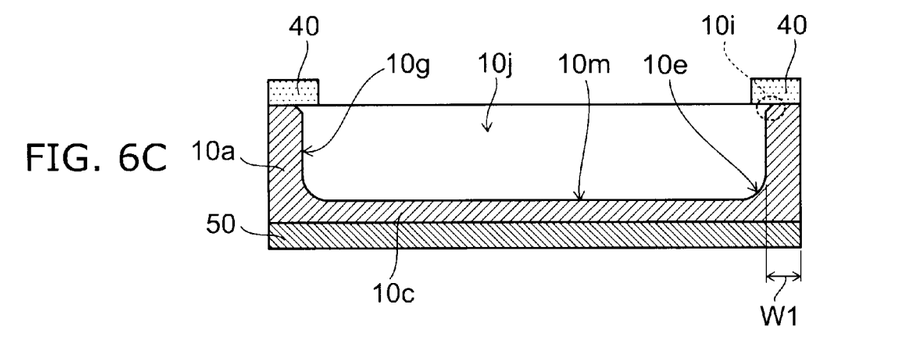

FIG. 6 is a process cross-sectional view illustrating a method for manufacturing a wafer according to the first and second embodiment.

Figure 7:
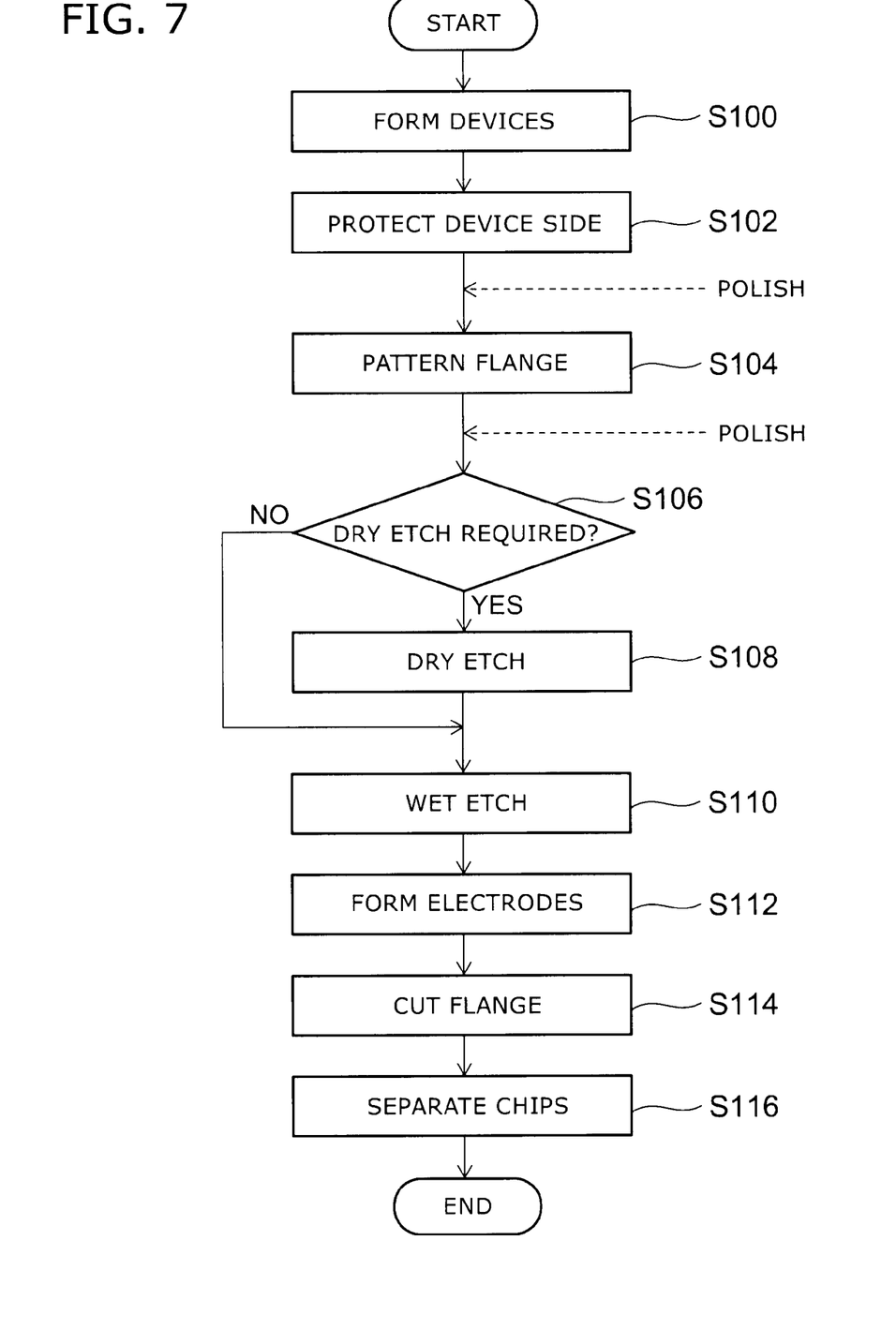
FIG. 7 is a flow chart illustrating the method for manufacturing.

FIG. 7 is a flow chart illustrating the method for manufacturing a wafer according to the first and second embodiment.

First, a plurality of devices are formed in the first surface of the wafer 10 (S100). Then, as shown in FIG. 6A, the surface on the device side is covered illustratively with a protective tape 50 (S102).

Subsequently, as shown in FIG. 6B, a recess 10j is formed. The recess 10j can be formed illustratively by the wet etching method. However, the method is not limited thereto, but can be combined with mechanical polishing. In the case where the inner wall 10g of the reinforcing flange 10a is not circular, it is possible to use a polishing apparatus capable of controlling a grinding wheel also in a non-circular region. Use of a polishing process can accelerate processing, and hence facilitates increasing the productivity.

In the case based on etching, a mask material 40 is patterned on a portion of the second or rear surface of the wafer 10 on which a reinforcing flange 10a is to be formed (S104). The mask material 40 can be a photoresist or an insulating film illustratively made of $SiO_2$. In the case of using a polishing process in combination, it can be performed before or after the patterning step (S104).

It is determined whether to use dry etching (S106). In the case of not using dry etching, control proceeds to step S110. In the case of using dry etching, control proceeds to step S108. Dry etching can illustratively be RIE (reactive ion etching). As compared with polishing, dry etching has a slower processing rate, but is superior in controllability. Hence, the width of the reinforcing flange 10a can be easily controlled to 1 mm or less. FIG. 6B is a schematic cross-sectional view after polishing or dry etching, for example. The thickness of the thin section 10c can illustratively be 100 to 200 μm.

In the case of a silicon wafer, subsequently, hydrofluoric acid or a mixed solution of hydrofluoric acid and nitric acid is illustratively used to perform wet etching (S110). At the lower end of the inner wall of the reinforcing flange 10a, a taper 10e with C in the range of 3 to 100 μm or a downward convex curved surface with R in the range of 3 to 50 μm can be formed. Furthermore, at the upper end corner of the inner wall of the reinforcing flange 10a, a C surface 10i with C in the range of 0.5 to 20 μm or a curved surface with R in the range of 0.5 to 20 μm is formed.

FIG. 6C is a schematic cross-sectional view after wet etching. The thickness of the thin section 10c can illustratively be 30 to 150 μm. As compared with polishing, wet etching has a slower processing rate, but can smooth the surface roughened by polishing and dry etching. Furthermore, the edging process based on wet etching is less likely to produce slips than polishing and dry etching, and hence can prevent degradation in characteristics and reliability due to crystal defects. Moreover, chipping and dust generation can be avoided. It is noted that the device formation process described above with reference to FIG. 6A can be performed after or during the formation of the thin section 10c.

Subsequently, electrodes are formed on the bottom 10m of the recess 10j (S112), and the reinforcing flange 10a is cut off (S114). Furthermore, chip separation is performed (S116).

Thus, in the wafer manufacturing method of this example, a mask material 40 is patterned on the portion which is to serve as a reinforcing flange 10a, and wet etching is used to form a reinforcing flange 10a having a narrow width. This facilitates easily manufacturing a wafer capable of maintaining the mechanical strength while keeping the small thickness. Consequently, the ineffective region of the wafer can be reduced, the total number of devices can be increased, and devices with improved characteristics and reliability can be manufactured with high yield.

Figure 8:
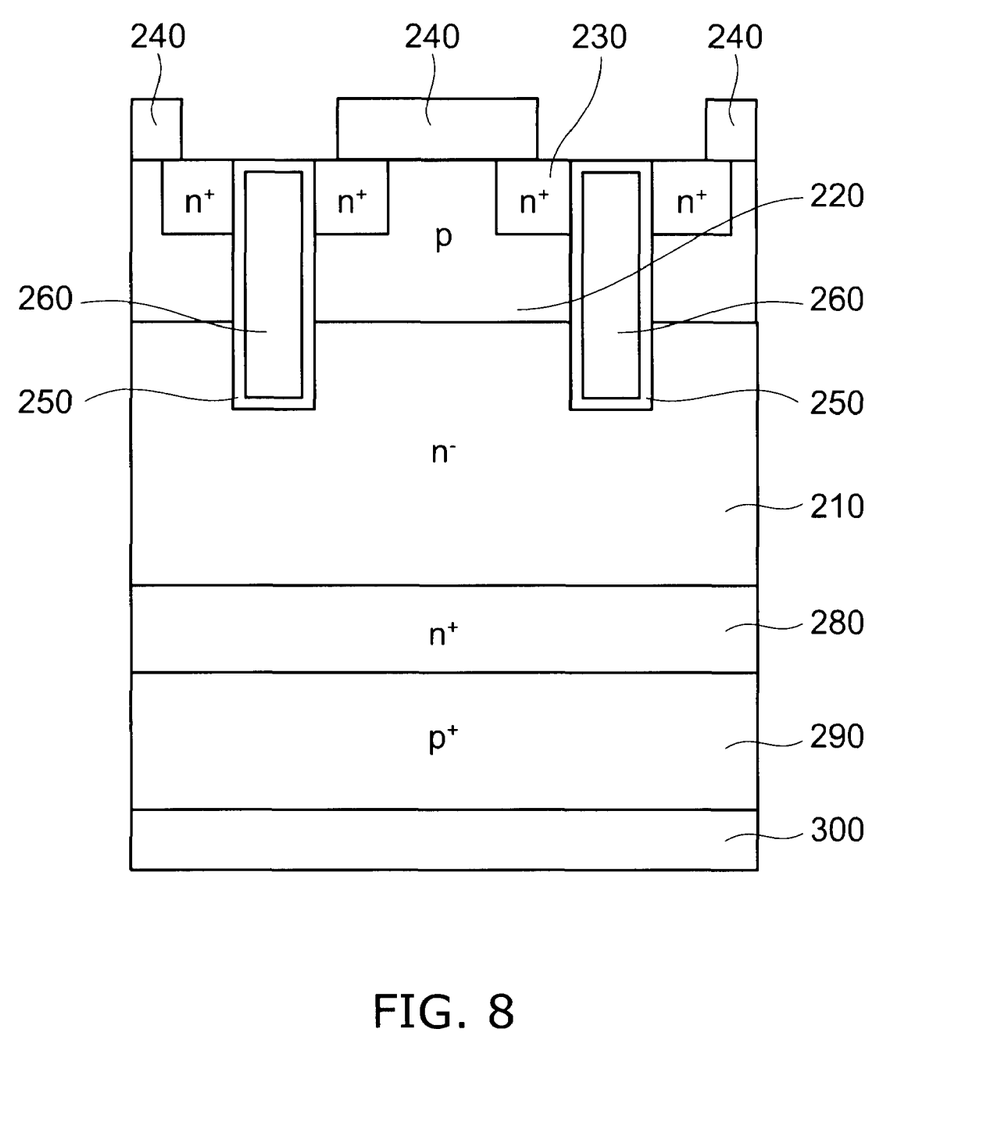
FIG. 8 is a schematic diagram showing a cross-sectional structure of an insulated gate bipolar transistor (IGBT) fabricated by a manufacturing method according to the present invention.

FIG. 8 is a schematic diagram showing a cross-sectional structure of an insulated gate bipolar transistor (IGBT) fabricated by a manufacturing method according to the present invention.

The IGBT includes a $n^-$-type drift layer 210, p-type base layer 220 provided on the drift layer 210, $n^+$-type emitter layer 230 selectively provided on the base layer 220, gate electrode 260 provided in a trench which penetrates the emitter layer 230 and the base layer 220 and reaches the drift layer 210, and gate insulating layer 250 covering the gate electrode 260. Emitter electrode 240 is connected to the emitter layer 230. On the lower side of the drift layer 210, $n^+$-buffer layer 280 and $p^+$-anode layer 290 are provided. Further, collector electrode 300 is formed on the lower surface of the anode layer 290.

Figure 9:
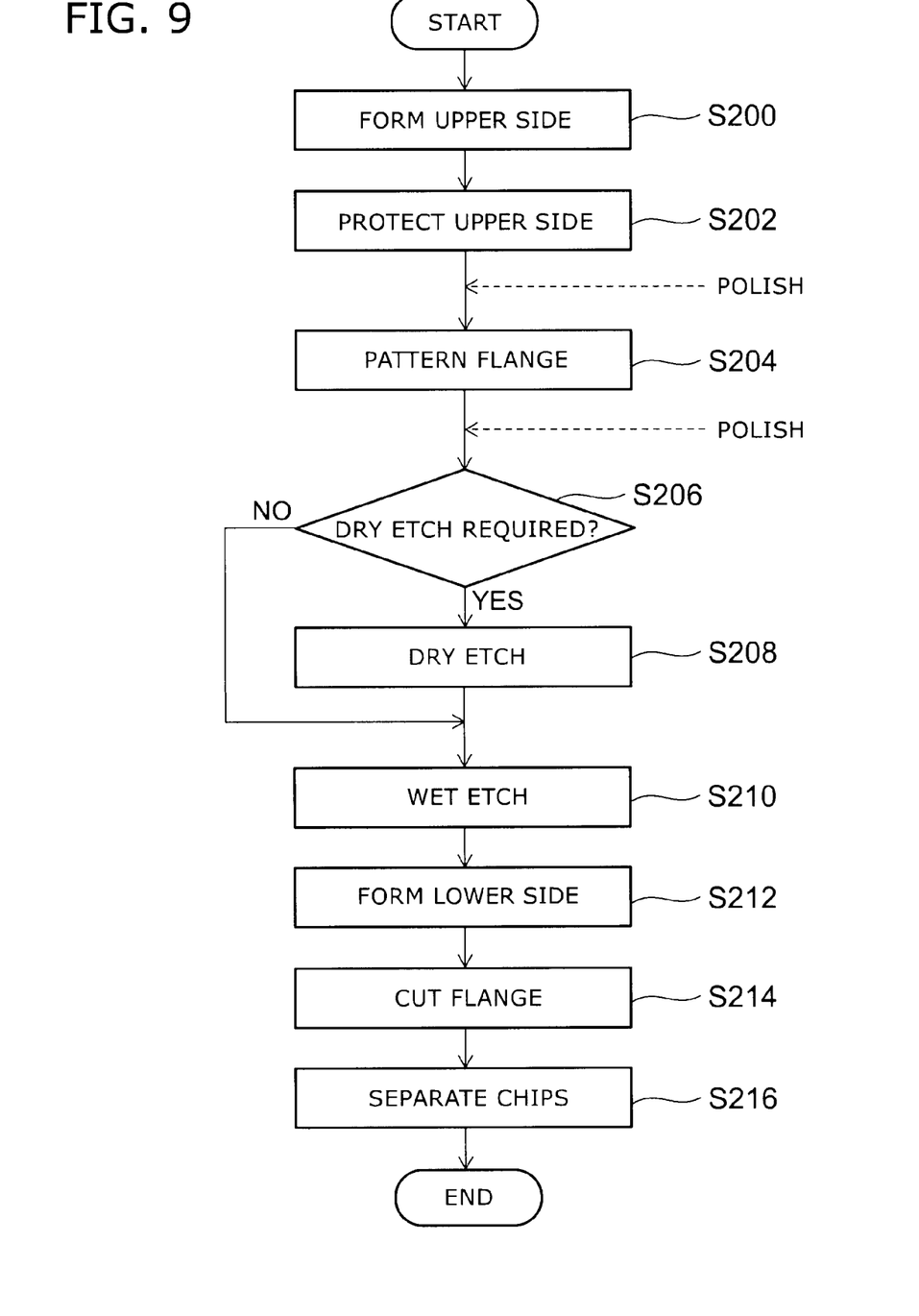
FIG. 9 is a flow chart illustrating the method for manufacturing the IGBT shown in FIG. 8.

FIG. 9 is a flow chart illustrating the method for manufacturing the IGBT shown in FIG. 8.

First, upper sides of a plurality of IGBTs are formed in the first surface of a silicon wafer (S200). The wafer may be formed of $n^-$-silicon crystal having an impurity concentration which is same as the drift layer 210. Then, the base layer 220 and the emitter layer 230 are formed on the surface region of the wafer. Further, trenches are formed on the surface of the wafer, and the gate insulating film 250 the gate electrodes 260 are formed in the trenches. Then, the emitter electrodes 240 are formed on the emitter layer 230. The emitter electrodes 240 may be formed in the later step after the wafer is etched (S210).

Then, the upper sides of the IGBTs are covered, for example, with a protective tape (S202).

Subsequently, as explained with reference to FIG. 6B, a recess 10; is formed. In the case based on etching, a mask material is patterned on a portion of the lower or rear surface of the wafer on which a reinforcing flange 10a is to be formed (S204).

It is determined whether to use dry etching (S206). In the case of not using dry etching, control proceeds to step S210.

In the case of using dry etching, control proceeds to step S208. Dry etching can illustratively be RIE (reactive ion etching).

In the case of a silicon wafer, subsequently, hydrofluoric acid or a mixed solution of hydrofluoric acid and nitric acid is illustratively used to perform wet etching (S210).

Subsequently, lower sides of IGBTs are formed on the bottom 10m of the recess 10j (S212). Specifically, the buffer layer 280, the anode layer 290, and the collector electrode 300 are formed on the lower side of the drift layer 210.

Then, the reinforcing flange 10a is cut off (S214). Furthermore, IGBT chip separation is performed (S216). The present embodiments have been described with reference to a silicon wafer. However, the material of the wafer is not limited to silicon, but can be SiC and other compound semiconductors.

The embodiments of the invention have been described with reference to the drawings. However, the invention is not limited to these embodiments. The shape, size, and layout of the reinforcing flange, taper, curved surface, orientation notch, and orientation flat constituting the wafer can be modified by those skilled in the art without departing from the spirit of the invention, and such modifications are also encompassed within the scope of the invention.

The invention claimed is:

1. A wafer with an orientation notch being cut in a portion of its circumference, the wafer comprising:
   a reinforcing flange formed upright at periphery; and
   a thin section surrounded by the reinforcing flange and having a smaller thickness than the reinforcing flange,
   the reinforcing flange including a circumferential portion formed upright along the circumference and a notch portion formed upright near the orientation notch, and
   a width of the circumferential portion as viewed parallel to a major surface of the wafer being smaller than a depth of the orientation notch as viewed parallel to the major surface.

2. The wafer according to claim 1, wherein a width of the notch portion is generally the same as the width of the circumferential portion.

3. The wafer according to claim 1, wherein a width of the notch portion is larger than the width of the circumferential portion.

4. The wafer according to claim 1, wherein an inner wall of the notch portion is in a generally planar shape.

5. The wafer according to claim 1, wherein a width of the notch portion decreases with the distance from the orientation notch.

6. The wafer according to claim 1, wherein an upper end of tan inner wall of the reinforcing flange adjacent to the thin section has a taper or a curved surface.

7. The wafer according to claim 6, wherein a lower end of an inner wall of the reinforcing flange adjacent to the thin section has a taper or a curved surface.

8. The wafer according to claim 1, wherein a lower end of an inner wall of the reinforcing flange adjacent to the thin section has a taper or a curved surface.

* * * * *